United States Patent
Nakane et al.

(10) Patent No.: US 8,173,579 B2
(45) Date of Patent: May 8, 2012

(54) FABRICATION METHOD OF A MGB$_2$ SUPERCONDUCTING TAPE AND WIRE

(75) Inventors: Takayuki Nakane, Ibaraki (JP); Hitoshi Kitaguchi, Ibaraki (JP); Hiroki Fujii, Ibaraki (JP); Hiroaki Kumakura, Ibaraki (JP)

(73) Assignee: National Institute for Materials Science, Ibaraki (JP)

( * ) Notice: Subject to any disclaimer, the term of this patent is extended or adjusted under 35 U.S.C. 154(b) by 871 days.

(21) Appl. No.: 12/084,035

(22) PCT Filed: Oct. 24, 2006

(86) PCT No.: PCT/JP2006/321174
§ 371 (c)(1), (2), (4) Date: Aug. 8, 2008

(87) PCT Pub. No.: WO2007/049623
PCT Pub. Date: May 3, 2007

(65) Prior Publication Data
US 2009/0156410 A1 Jun. 18, 2009

(30) Foreign Application Priority Data
Oct. 24, 2005 (JP) .................................. 2005-309131

(51) Int. Cl.
*H01B 12/00* (2006.01)
*C01B 35/04* (2006.01)

(52) U.S. Cl. ........ 505/430; 505/431; 505/230; 505/231; 505/704; 174/125.1; 29/599

(58) Field of Classification Search .................. 505/230, 505/231, 430, 431, 433, 490; 174/125.1; 29/599
See application file for complete search history.

(56) References Cited

U.S. PATENT DOCUMENTS
2002/0173428 A1* 11/2002 Thieme et al. ................ 505/100
(Continued)

FOREIGN PATENT DOCUMENTS
JP 2003-331670 11/2003
(Continued)

OTHER PUBLICATIONS

Kumakura et al, "Upper critical fields of powder-in-tube-processed MgB2/Fe tape conductors," Apl. Phys. Lett. May 2004, 84(18), pp. 3669-3671.*
(Continued)

*Primary Examiner* — Stanley Silverman
*Assistant Examiner* — Kallambella Vijayakumar
(74) *Attorney, Agent, or Firm* — Wenderoth, Lind & Ponack, L.L.P.

(57) ABSTRACT

In a fabrication method of a MgB$_2$ superconducting tape and wire by filling a tube with a MgB$_2$ superconducting powder and forming it into a tape or wire, a fabrication method of a MgB$_2$ superconducting tape (and wire) which is characterized by using a MgB$_2$ superconducting powder having a high critical current density ($J_c$) owing to its lowered crystallinity and having potential for excellent grain connectivity as the MgB$_2$ superconducting powder. Provided are a fabrication method of a MgB$_2$ superconducting tape and wire which can fabricate a MgB$_2$ superconducting tape and wire having a level of $J_c$ sufficiently high for practical applications and homogeneous quality throughout its length by an ex-situ process employing a material of the composition suitable for its working environment as the sheath material, and a MgB$_2$ superconducting tape and wire thereby fabricated.

11 Claims, 16 Drawing Sheets

U.S. PATENT DOCUMENTS

| | | | |
|---|---|---|---|
| 2002/0198111 A1* | 12/2002 | Tomsic | 505/230 |
| 2004/0204322 A1* | 10/2004 | Tanaka et al. | 505/100 |
| 2005/0174202 A1* | 8/2005 | Tanaka et al. | 335/6 |

FOREIGN PATENT DOCUMENTS

| | | | |
|---|---|---|---|
| JP | 2004-111237 | | 4/2004 |
| JP | 2005-129412 | | 5/2005 |
| JP | 2005-310600 | | 11/2005 |
| JP | 2006-143500 | | 6/2006 |
| WO | WO 02/103716 | * | 12/2002 |

OTHER PUBLICATIONS

International Search Report issued Dec. 26, 2006 in the International (PCT) Application PCT/JP2006/321174 of which the present application is the U.S. National Stage.

Nakane et al., Improvement of Ex-Situ $MgB_2$ Powder in Tube Processed Tapes Using $MgH_2$ Powder, p. 1 Program and Abstracts of the 18th International Symposium on Superconductivity, Oct. 24-26, 2005, Tsukuba, Japan, Abstract WTP-96.

* cited by examiner

*Fig. 2*
[Preparation of raw material powder (equal to method of preparing a MgB$_2$ tape by the in-situ process)]
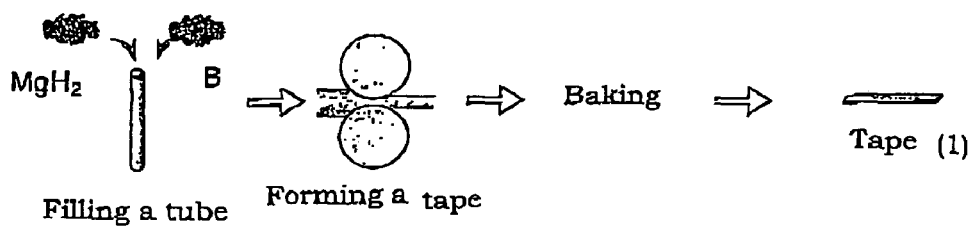
[Collection of raw material powder]
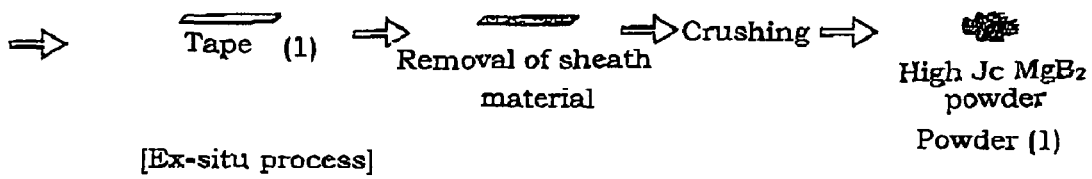
[Ex-situ process]
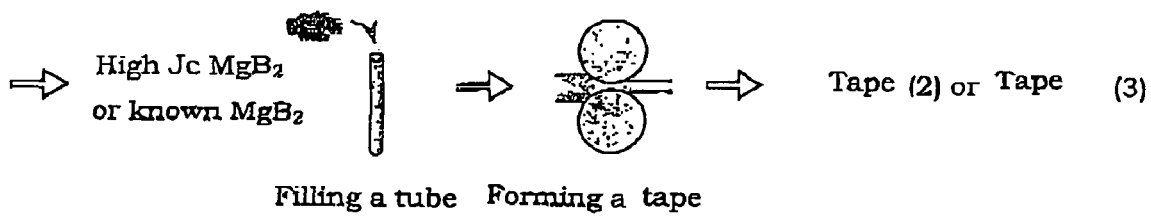

Fig. 3
(1) 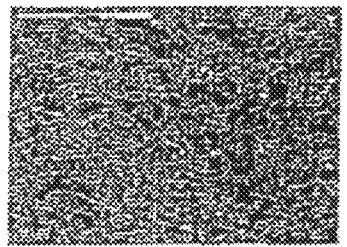   (2) 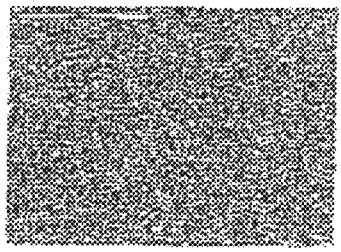   (3) 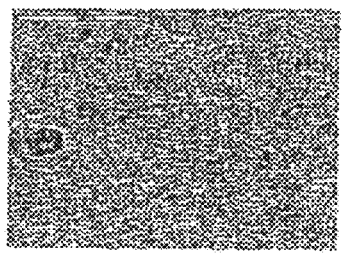

Fig. 10

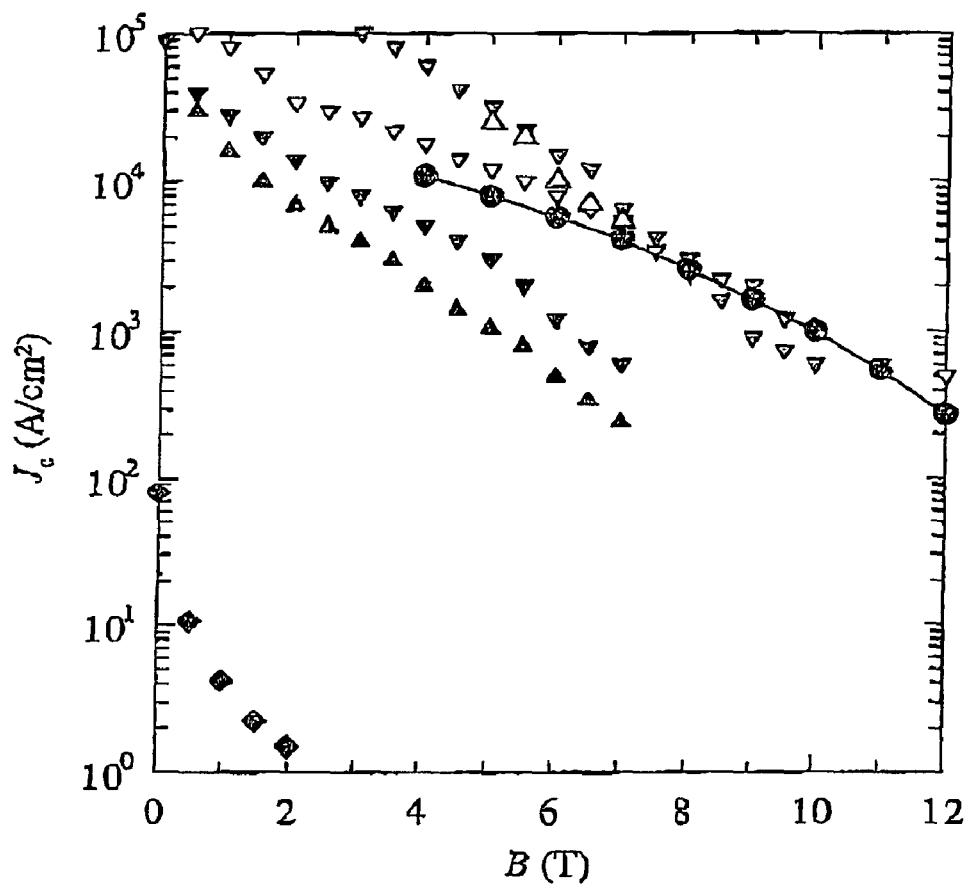

*1 G. Grasso et al. Superconductors Science and Technology 16(2003)799
*2 A. Serquis et al. Applied Physics Letter 82(2003)1754

(7) ● Ex-situ Al-sheathed tape (new method) - Not heat treated /
▼ Ex-situ metal tape (*1) - Not heat treated /
▽ Ex-situ metal tape (*1) - Heat treated /
▽ Ex-situ metal tape (*1) - Heat treated /
▲ Ex-situ SUS tape (*2) - Not heat treated /
△ Ex-situ SUS tape (*2) - Heat treated /
(8) ◆ Ex-situ Al-sheathed tape (prior art) - Not heat treated ○ Ex-situ tape made by new method (by adding SiC and heating at 700°C)(9)
◉ Ex-situ tape made by new method (by heating at 600°C)(4)
⊕ Ex-situ tape made by new method (2)
○ Ex-situ tape made by the prior art (by heating at 600°C)(5)
□ In-situ tape (1)

+ Ex-situ tape made by new method (by adding SiC and heating at 700°C)(9)
● Ex-situ tape made by new method (by heating at 600°C)(4)
○ Ex-situ tape made by the prior art (by heating at 600°C)(5)
□ In-situ tape (1)

▲ Ex-situ tape made by new method (by adding In and heating at 600°C)(10)
● Ex-situ tape made by new method (by heating at 600°C)(4)
○ Ex-situ tape made by the prior art (by heating at 600°C)(5)
□ In-situ tape (1)

- Ex-situ tape made by new method (by heating at 600°C for an hour)(11)
- Ex-situ tape made by new method (by heating at 300°C for 10 hours)(12)
- Ex-situ tape made by new method (2)

FABRICATION METHOD OF A MGB$_2$ SUPERCONDUCTING TAPE AND WIRE

TECHNICAL FIELD

The invention of the present application relates to a fabrication method of a MgB$_2$ superconducting tape and wire. More particularly, it relates to a fabrication method for a MgB$_2$ superconducting tape and wire having a critical current density ($J_c$) sufficiently high for practical use by employing an ex-situ powder in tube process which can impart homogeneous quality throughout its length and employ a material with the composition suitable for its working environment as the sheath material, and a MgB$_2$ superconducting tape and wire thereby fabricated.

BACKGROUND ART

As magnesium diboride (MgB$_2$), superconductor discovered in Japan in 2001, has a superconducting critical temperature ($T_c$) of 39 K higher than that of any other metallic superconductor and is relatively easy to form into a bulk material or a tape (or wire), its physical properties and its formation into a tape and wire are widely investigated throughout the world.

A powder-in-tube (PIT) method in which a metal tube (sheath material) is filled with a raw material powder to form it into a tape or wire is known as a principal method of forming a tape and wire of a superconductor. The PIT method can be roughly classified by a difference in raw material powder into an ex-situ process utilizing a MgB$_2$ superconducting powder itself, and an in-situ process utilizing a powder mixture of e.g. a Mg powder and a B powder and converting it into a superconductor by heat treatment after forming a tape (or wire) shape. The ex-situ process has an advantage over the in-situ process in fabricating a homogeneous tape (and wire) and being suitable for the fabrication of a long tape and wire. Moreover, while the in-situ process has no alternative but to use as a sheath material e.g. iron or a nickel alloy having no likelihood to react with the raw maternal powder at the heat treatment, the ex-situ process, which makes it possible to obtain superconducting performance without any heat treatment after forming a tape (or wire), permits a broader range of free selection for the sheath material and makes it possible to use some sheath materials with the composition suitable for its working environment, and its application is expected.

DISCLOSURE OF THE INVENTION

Problems to be Solved by the Invention

However, the tape (and wire) fabricated by the ex-situ process has never been of high critical current density ($J_c$), but a superconducting tape (and wire) obtained by employing a MgB$_2$ powder commonly used as a raw material has a very low level of $J_c$, which has been too low to be discussed for any practical use. Accordingly, it is presently the case with the ex-situ process that a large number of research attempts are under way to achieve an improved $J_c$. These attempts include a method employing a sheath material of different composition and a method giving heat treatment after forming a tape (or wire) which have been found to be certainly effective for achieving an improving $J_c$, but these methods have been unable to make any effective use of the inherent advantages of the ex-situ process featured by the free selection of a sheath material and no necessity for heat treatment. Neither these nor any other method has been able to improve the $J_c$ of any MgB$_2$ superconducting tape (or wire) fabricated by the ex-situ process to a level equal to, or higher than the $J_c$ of any tape (or wire) fabricated by the in-situ process. Accordingly, in-situ process of PIT method is commonly employed for the fabrication of a superconducting tape and wire.

The invention of the present application has been made under the circumstances stated above and is aimed at overcoming the problems of the prior art and providing a fabrication method of a MgB$_2$ superconducting tape and wire which can fabricate a MgB$_2$ superconducting tape (and wire) having a level of $J_c$ sufficiently high for practical uses and homogeneous quality throughout its length by employing a material with suitable composition for its working environment as the sheath material, and fabricated MgB$_2$ superconducting tape (ad wire) by this method.

Means for Solving the Problems

In order to solve the problems stated above, the invention of the present application firstly provides a fabrication method of a MgB$_2$ superconducting tape and wire which is characterized in that a MgB$_2$ superconducting powder having potential for excellent grain connectivity and having high critical current density ($J_c$) owing to its lowered crystallinity is used as a MgB$_2$ superconducting powder for the ex-situ process in which a tube is filled with a MgB$_2$ superconducting powder to form it into a tape or wire.

Secondly, it provides a fabrication method of a MgB$_2$ superconducting tape and wire as set forth above, characterized in that a MgB$_2$ superconductor obtained by filling a tube with a powder mixture of magnesium (Mg) or magnesium hydride (MgH$_2$) and boron (B) to form it into a tape (or wire), heating the tape (or wire), and crushing the formed MgB$_2$ superconductor into a powder form. The ratio of Mg or MgH$_2$ and B mixed to obtain the MgB$_2$ superconductor is in a Mg:B range of 0.9:2 to 1.1:2.

Thirdly, it provides a fabrication method of a MgB$_2$ superconducting tape and wire as set forth above, characterized in that a powder of a ceramic material including carbon (C), a transition metal or an organic compound containing an aromatic compound is added to the powder mixture.

Fourthly, it provides a fabrication method of a MgB$_2$ superconducting tape and wire as set forth above, characterized in that a powder of SiC or In (indium) is added to the powder mixture.

Fifthly, it provides a fabrication method of a MgB$_2$ superconducting tape and wire as set forth above, characterized in that the tube is a metal tube containing one or more of the elements Fe, Cu, Al, Nb, Ti, Mg, Ag, Au and Li.

Sixthly, it provides a fabrication method of a MgB$_2$ superconducting tape and wire as set forth above, characterized in that the tube filled with the powder mixture is an Fe tube.

Seventhly, it provides a fabrication method of a MgB$_2$ superconducting tape and wire as set forth above, characterized in that a tube filled with the MgB$_2$ superconducting powder is an Al tube.

Eighthly, it provides a fabrication method of a MgB$_2$ superconducting tape and wire as set forth above, characterized in that a multicore tape and wire are formed by e.g. bundling a plurality of tubes filled with the MgB$_2$ superconducting powder or filling a metal rod having a plurality of bores with the raw material powder.

Ninthly, it provides a fabrication method of a MgB$_2$ superconducting tape and wire as set forth above, characterized in that a tape or wire formed from a tube filled with the MgB$_2$ superconducting powder is heated, if required.

According to a tenth aspect, it provides a MgB$_2$ superconducting tape and wire characterized by being fabricated by any of the methods as set forth above.

According to an eleventh aspect, it provides a MgB$_2$ superconducting tape and wire characterized by comprising elongated MgB$_2$ covered with a light-element metal as the sheath material, and having a critical current density (J$_c$) of 900 A/cm$_2$ or above at 10 T and 4.2 K.

According to a twelfth aspect, it provides a MgB$_2$ superconducting tape and wire characterized in that the light-element metal is Al.

According to a thirteenth aspect, it provides a MgB$_2$ superconducting tape and wire characterized in that the MgB$_2$ with SiC or In (indium) additives.

According to a fourteenth aspect, it provides a MgB$_2$ superconducting tape and wire characterized in that the tape and wire is a multicore tape and wire made by e.g. bundling a multiplicity of elongated MgB$_2$ wires covered with a sheath material, or filling a metal rod having a plurality of bores with the raw material powder to form a tape or wire.

According to a fifteenth aspect, it provides an article characterized by employing any of the MgB$_2$ superconducting tape and wire as set forth above.

BRIEF DESCRIPTION OF THE DRAWINGS

FIG. 2 is a schematic illustration of a fabrication process for a MgB$_2$ superconducting tape in Example 1.

FIG. 3 shows cross-sectional SEM images of Fe-sheathed MgB$_2$ superconducting tape made in Example 1.

FIG. 10 shows comparison of J$_c$-B characteristics between Al-sheathed MgB$_2$ superconducting tapes in Example 4 and that of the MgB$_2$ tapes or wires known having highest performance and fabricated by the ex-situ process.

BEST MODE FOR CARRYING OUT THE INVENTION

Figure 1:
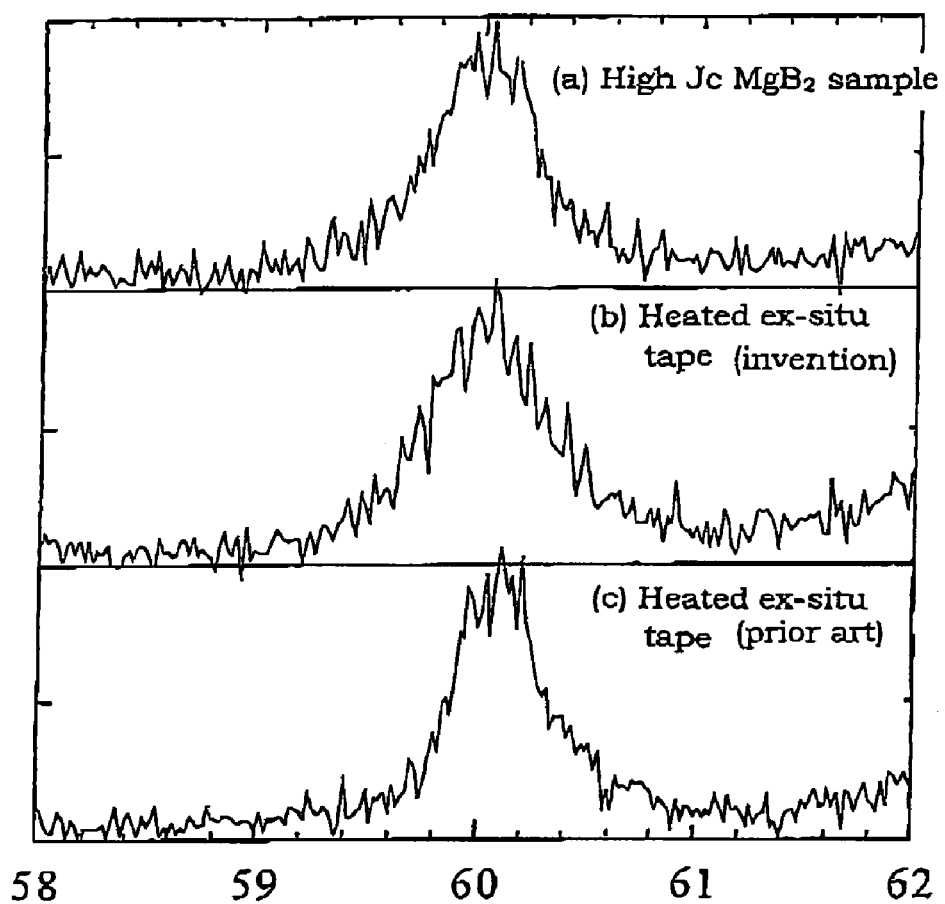
FIG. 1 shows the full width of half maximum of the 110 peak of X-ray diffraction patterns of a raw material powder and core of Fe-sheathed MgB$_2$ superconducting tape.

The invention of the present application has the features as described above and the following is a description of modes of carrying it out.

The fabrication method of a MgB$_2$ superconducting tape and wire which the invention of the present application provides is a fabrication method of a MgB$_2$ superconducting tape and wire by the ex-situ process in which a tube is filled with a MgB$_2$ superconducting powder to form a tape or wire, and characterized by using a MgB$_2$ superconducting powder having potential for excellent grain connectivity and having high critical current density (J$_c$) owing to its low crystallinity.

A superconducting powder of high T$_c$ and excellent crystallinity is generally considered preferable to use as a raw material powder for fabricating a superconducting tape or wire of high performance by the ex-situ process. However, the invention of the present application employs as a raw material a powder of high J$_c$ and high potential for excellent grain connectivity in order to obtain a superconducting tape and wire of excellent J$_c$ characteristics. The "high J$_c$" and "high potential for excellent grain connectivity" of the MgB$_2$ superconducting powder as the raw material can be understood as meaning that its J$_c$ and grain connectivity are high as compared with an ordinary MgB$_2$ powder. When these characteristics are evaluated, they can easily be compared by, for example, examining the J$_c$-B characteristics for the J$_c$ value and examining the AC magnetic field dependence of superconducting transition curve for the grain connectivity.

More specifically, the Mg powder used as the raw material by the invention of the present application is characterized by its relatively low crystallinity with, for example, a T$_c$ of about 36 K which is lower than the T$_c$ (about 39 K) of any known ordinary MgB$_2$ powder, as stated above. The low crystallinity of the MB$_2$ powder shortens its coherence length indicating the spatial extension of the superconducting electron coupling, thereby improving the critical value of the magnetic field which is proportional to the reciprocal of the square of its coherence length, while lowering its T$_c$. As the improved critical value of the magnetic field leads to an improvement of the maximum value of the magnetic field allowing a superconductor to pass an applied electric current, there apparently follows an improvement of J$_c$ in a high magnetic field. According to the invention of the present application, these characteristics are considered to contribute greatly to improving the J$_c$ of the superconducting tape and wire.

The MgB$_2$ superconducting powder as the raw material can be prepared by forming into a powder a MgB$_2$ superconductor obtained by filling a tube with a powder mixture of magnesium (Mg) or magnesium hydride (MgH$_2$) and boron (B) to form a tape and heat treating it, as stated before. The MgB$_2$ superconducting powder can also be understood as a powder formed from the superconducting core of a MgB$_2$ tape or wire by the known in-situ process.

As regards the powders of Mg or MgH$_2$ and B, it is possible to consider as a preferred example the use of, for example, ones having a purity of 90% or above and an average particle diameter of about 100 μm or less so that the J$_c$ and potential for excellent grain connectivity of the resulting raw material powder may be excellent. It is considered that the higher the purity, the better, while the smaller the particle diameter, the more desirable. As a guide for the mixing ratio of Mg or MgH$_2$ and B, it is possible to try to obtain, for example, a Mg:B ratio of, say, 0.9:2 to 1.1:2. The powder mixture of MgH$_2$ and B is preferably stored in, for example, a vacuum or an inert gas because of a low humidity and a low oxygen partial pressure.

The various types tube for filling with the powder mixture is possible to employ, if it is a tube which is neither broken in a later tape (or wire)-forming process, nor reacts with the powder mixture during heat treatment. The tube filled with the powder mixture may, as a preferred example, be a metal tube containing one or more of the elements Fe, Cu, Nb, Ti, Mg, Ag, Au and Li. In view of the stress effect during the formation of a tape and wire, it is more preferable to use e.g. an Fe or SUS tube.

While there is no particular limitation as to details of technique for forming a tape or wire, it is preferable to employ a technique which can give a satisfactorily high density to the powder mixture in order to obtain a MgB$_2$ superconducting raw material powder with high J$_c$ and potential for excellent grain connectivity. More specifically, it is, for example, preferable to use a metal tube having as large a diameter as possible to increase a cross-sectional reduction, as it is expected to achieve the pulverization of particles, the preparation of a powder of high density and a stress effect on MgB$_2$. It is alternatively possible to consider any other technique that is equally or even more effective.

Heat treatment may be performed under conditions causing the powder mixture to react and form MgB$_2$. Referring to the conditions for heat treatment, it is preferable to lower humidity and oxygen partial pressure, and it will, for example, be possible to realize an oxygen partial pressure of 10% or less. The lower the oxygen partial pressure, the more desirable, and 1% or less is, for example, preferable. Although there is no particular limitation as to the temperature for heat treatment, it will, for example, be possible to perform heating at a relatively low temperature not exceeding 750° C. There is no limitation as to time, but it may be determined by taking the amount of the powder mixture, etc. into account, and it will, for example, be suitable to perform heat treatment at, say, 600-650° C. for, say, an hour.

The MgB$_2$ superconductor existing as a core is taken out of the inside of the MgB$_2$ superconducting tape (or wire) thereby formed and is formed into a powder, whereby it is possible to obtain a MgB$_2$ superconducting powder as the raw material for the invention of the present application. The MgB$_2$ superconducting powder as the raw material may be of, say, 100 μm or less, and the finer, the more desirable.

The fabrication method of a MgB$_2$ superconducting tape and wire according to the invention of the present application forms a tape (or wire) by filling a tube with the MgB$_2$ superconducting powder as described above and permits the use of any of various kinds of tubes as the tube for filling with the MgB$_2$ superconducting powder if it is a tube of material which is not broken at tape (or wire) forming process. It will, for example, be possible to use a metal tube containing one or more of the elements Fe, Cu, Al, Nb, Ti, Mg, Ag, Au and Li to make the tube serve as a sheath material. In order to increase a cross-sectional reduction and thereby obtain a MgB$_2$ superconducting tape or wire having still better characteristics, it is desirable to use as a sheath material e.g. a high-strength material, such as stainless steel of high hardness and rich ductility. The use of e.g. an Fe or SUS tube facilitating a stress effect at the time of formation of a tape or wire is shown as a more preferable example. On the other hand, it is also possible to use a light materials, such as Al, though it may be low in hardness and soft. The realization of high characteristics by using Al as a sheath material for the MgB$_2$ superconducting tape (and wire) has for the first time been made by the invention of the present application.

Although there is no particular limitation as to details of e.g. means or conditions for a tape (and wire) forming technique, it is preferable to employ a technique giving a satisfactorily high density to the raw material powder in order to obtain a MgB$_2$ superconducting tape (or wire) having excellent J$_c$ characteristics. More specifically, it will, for example, be possible to perform a technique employing a metal tube having as large a diameter as possible to realize an increased cross sectional reduction, or employ a technique which is equally or still more effective.

It is possible to form a multicore tape or wire by, for example, bundling a plurality of tubes filled with the MgB$_2$ superconducting powder after forming a wire in each tube and inserting them into a tube. It is also possible to form a multicore tape or wire by filling a metal tube having a plurality of bores with the MgB$_2$ superconducting powder and thereby forming a tape or wire in each bore. There is, of course, no limitation as to e.g. the material of the tubes in either case.

The fabrication method of a MgB$_2$ superconducting tape and wire according to the invention of the present application does not necessarily require the heat treatment of the MgB$_2$ superconducting powder as the raw material, but may include the heat treatment of the MgB$_2$ superconducting tape or wire as formed in order to improve its desired characteristics, e.g. its J$_c$ characteristics, to a still further extent. The conditions for its heat treatment may, for example, include heating for, say, 0.01 to 100 hours at an oxygen partial pressure of 10% or less, preferably 1% or less in a temperature range of, say, 600-900° C. In this connection, it is necessary to choose one not reacting with MgB$_2$ as the tube to be filled with the MgB$_2$ superconducting powder in order to avoid the manufacture of any tape and wire having poor characteristics.

The invention of the present application makes it possible to add a powder of ceramics containing carbon, a transition metal or an aromatic organic compound to the powder mixture when preparing the MgB$_2$ superconductor as the raw material powder. Specific examples of the powders, which can be added, are a powder of SiC and various kinds of transition metals including In, Sn, Sb, Te, Sr, Y, Zr, Nb, Mo, Ru, Rh, Pd, Ga, Ge, Sc, Ti, V, Cr, Mn, Fe, Co, Ni, Cu, Zn, Pb, Bi, Pt, Hf, Ta and Hg.

It is also possible to mention as typical examples powders of aromatic compounds, such as benzene, toluene, xylene, naphthalene, perylene and anthracene. When a powder of SiC or In is, for example, mixed, it is possible to add, say, 2.5 to 35 mol % and preferably 10 to 25 mol % of a powder having an average particle diameter of, say, 100 μm or less and preferably, say, 10 nm to 1 μm. As to the timing for the addition of the powder, it does not matter whether it may be mixed with the starting materials before MgB$_2$ sintering, or it may be mixed with MgB$_2$ as prepared, if it precedes the formation of a tape and wire by the ex-situ process, but in order to obtain still better results, a compound containing carbon is preferably mixed with the starting materials before MgB$_2$ sintering, while a transition metal, such as In, is preferably mixed with the MgB$_2$ powder as prepared. The addition of e.g. a SiC powder makes it possible to improve the J$_c$ characteristics of the MgB$_2$ superconducting tape and wire to a further extent even without the heat treatment of the MgB$_2$ superconducting tape and wire. It follows that when a material reacting with MgB$_2$ is used for the tube, the use of the MgB$_2$ superconducting powder mixed with, for example, a SiC or In powder makes it possible to obtain a tape or wire of high performance without any additional heat treatment.

The fabrication method of a MgB$_2$ superconducting tape and wire as described above provides a superconducting tape and wire having satisfactorily high J$_c$ characteristics even by the ex-situ process. As it employs the ex-situ process, it is of great significance from an industrial aspect, since it can fabricate a tape and wire of homogeneous quality easily as compared with the in-situ process and can fabricate an elongated tape and wire having a length of 100 m or more, or even 1 km or more.

The $MgB_2$ superconducting tape (and wire) provided by the invention of the present application is fabricated by the ex-situ process and realizes the tape (and wire) with excellent characteristics in a magnetic field of high strength. For example, an Fe-sheathed material ensures very excellent $J_c$ characteristics including 1,000 A/cm$^2$ or more at 4.2K and 12 T and 3,000 A/cm$^2$ or more at 4.2K and 10 T. An Al-sheathed material ensures excellent $J_c$ characteristics including 200 A/cm$^2$ or more at 4.2K and 12 T and 900 A/cm$^2$ or more at 4.2K and 10 T. The $MgB_2$ superconducting tape and wire according to the invention of the present application as described is fabricated typically by the method of the invention as described above.

Accordingly, the $MgB_2$ superconductor in the tape or wire is considered to have a coherence length shortened by its low crystallinity and thereby an improved critical value of magnetic field strength despite its lower $T_c$. Its lower crystallinity induces strain more likely to occur in the crystal during the formation of a tape and wire by the ex-situ process, leading to a shortened coherence length and thereby an improved critical value of magnetic field strength. As its improved critical value of magnetic field strength leads to an improvement in the maximum value of magnetic field allowing the superconductor to pass an applied electric current therethrough, it is considered that as a result, its $J_c$ in high magnetic field is improved. The $MgB_2$ superconductor in the tape prepared by the invention of the present application shows a full width of half maximum of 0.5° or more at the 110 peak of its X-ray diffraction pattern as shown in (b) of FIG. 1, and is characterized by showing a definitely larger value than the value of, say, 0.4 of the $MgB_2$ superconductor in the tape and wire according to the prior art. FIG. 1 shows the full width of half maximum at the 110 peak of (a) the raw material powder for the $MgB_2$ superconducting tape prepared by the invention of the present application, (b) heated core of $MgB_2$ superconducting tape according to the invention of the present application, and (c) heated core of $MgB_2$ superconducting tape prepared by the ex-situ process of the prior art.

Moreover, the $MgB_2$ superconducting tape and wire according to the invention of the present application is an elongated piece of $MgB_2$ covered with e.g. Al as a sheath material and is realized as one showing high superconducting characteristics even in a magnetic field as high as 7 T or more, for example, a fully practically acceptable level of, say, 1.0× 10$^3$ A/cm$^2$ at 10 T and 4.2 K. Aluminum (Al) is a material drawing attention as a sheath material for a superconducting tape and wire owing to its good thermal conductivity, low cost, high electrical conductivity and excellent workability. However, Al and Mg easily react with each other and melting point of Al is low, so that utilization of Al as the sheath material is impossible for the in-situ process at the fabrication of a $MgB_2$ superconducting tape and wire. (Although an experiment enabling it has recently been reported, it is still considered as being practically impossible.) Although it is possible to use Al as a sheath material in the ex-situ process, the $J_c$ of the Al-sheathed $MgB_2$ superconducting tape (and wire) has been very low (80 A/cm$^2$ at 4 T and 4.2 K). In view of this, the $MgB_2$ superconducting tape and wire according to the invention of the present application, which employs Al as a tube (sheath material) can be said to have realized an entirely novel superconducting tape and wire.

Moreover, it is worthy of notice that Al, Mg and B are all light elements. Al is one of few metals that are more suitable than Fe, owing to its aspects such as lightweight, low induced radioactivity, thermal conductivity, electrical conductivity, magnetic property, workability and cost. $MgB_2$ is the only material that can be expected to form a tape or wire among the superconductors consist of light elements, and the $MgB_2$ superconducting tape and wire employing Al or any other light-element metal as a sheath material can be expected to provide a on-board magnet to be mounted on a rocket or Maglev train in view of weight saving. The property of a light element with low induced radioactivity can be expected to be application for a magnet of a nuclear fusion reactor. A superconducting magnet formed from an Nb compound is presently used as a magnet for plasma confinement for a nuclear fusion reactor, but as Nb is a radioactive material, it is imperative to store it for a long time in the order of several hundred years before it can be disposed of after its use in e.g. a nuclear fusion reactor. On the other hand, as the fabrication technique for a $MgB_2$ superconducting tape and wire according to the invention of the present application can provide a tape and wire for which a light-element metal with low induced radioactivity is used as a sheath material, it can overcome this problem as a magnet and is considered to be significant from an environmental standpoint and from the standpoint of cost for e.g. storage.

The $MgB_2$ superconducting tape and wire according to the invention of the present application as described above may contain a SiC powder added to $MgB_2$, whereby its $J_c$ characteristics are improved. It is not limited to a single-core tape and wire, but can also be realized as e.g. a multicore tape and wire having e.g. 10 to 1,000 or even 10,000 or more $MgB_2$ superconducting cores.

Examples will now be shown to describe modes of carrying out the invention of the present application in further detail. It is needless to say that the present invention is not limited to the following examples, but may include various modes varying from one another in details.

EXAMPLES

Example 1

A $MgB_2$ tape was fabricated in accordance with the step chart shown in FIG. 2. A powder mixture obtained by mixing a commercially available $MgH_2$ powder (ABOGADO, 325 mesh, 96% purity) and a commercially available powder of B (Sigma-Aldrich, 325 mesh, 99.99% purity) in a molar ratio of 1:2 was made to fill an iron tube (sheath material) having an outside diameter of 6.02 mm and an inside diameter of 3.5 mm and formed into a tape having a width of 5 mm and a thickness of 0.5 mm by groove-rolling and flat-rolling forming. The tape was placed in an alumina boat, covered with a titanium powder completely and heat treated at 600° C. for an hour in an argon atmosphere by using a tube furnace. In other words, the typical in-situ process of a $MgB_2$ tape were performed. The $MgB_2$ tape thereby obtained is called tape (1).

Then, the sheath material was removed from the tapes (1) as obtained above mechanically by using pincers or nippers, etc., whereby only the $MgB_2$ formed inside was collected. The collected $MgB_2$ was crushed in a mortar to form a powder.

The powder as obtained was again filled in an iron tube (sheath material) having an outside diameter of 6.02 mm and an inside diameter of 3.5 mm and formed into a tape having a width of 5 mm and a thickness of 0.5 mm by groove-rolling and flat-rolling. In other words, it can be considered that the typical ex-situ process of a MgB$_2$ tape were performed. The MgB$_2$ tape thereby obtained is called tape (2).

For comparison, a tape was made in the same way by employing a MgB$_2$ powder (Sigma-Aldrich, about 60 nm dia., 99.99% purity) used typical ex-situ process and is tape (3).

Cross sectional images of Fe-sheathed MgB$_2$ superconducting tape observed by a scanning electron microscope (SEM) for (1), (2) and (3) are shown in (1), (2) and (3) of FIG. 3, respectively.

Figure 4:
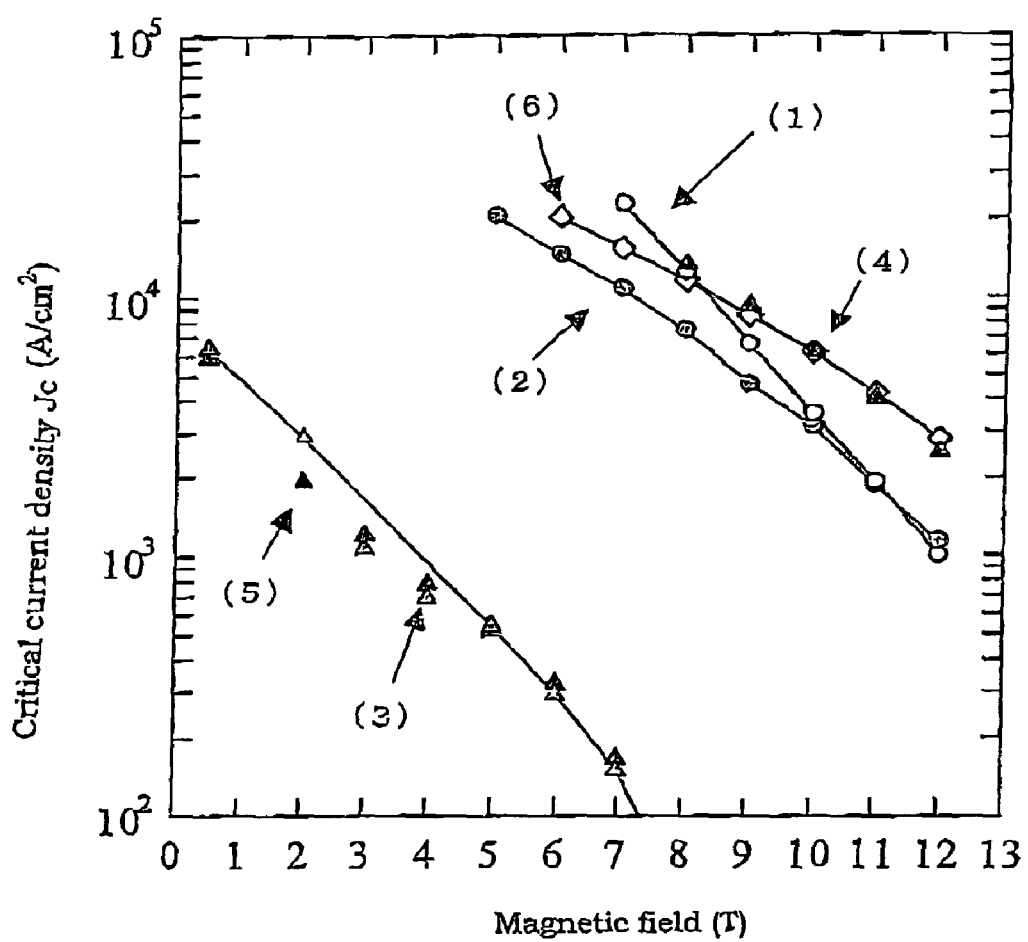
FIG. 4 shows the J$_c$-B characteristics of Fe-sheathed MgB$_2$ superconducting tapes made in Examples 1 and 2.

The critical current density J$_c$ of each tapes (1), (2) and (3) was measured in various magnetic fields at a liquid helium temperature and the results are shown in FIG. 4. It was confirmed that the tape (2) according to the invention of the present application showed J$_c$ by far higher than that of the tape (3) by the known ex-situ process. While the tape (3) by the known ex-situ process did not show superconducting characteristics in a high magnetic field over 7 T, the tape (2) according to the invention of the present application showed excellent characteristics as its J$_c$ value was comparable to that of the tape (1) made by the in-situ process and even exceeded the J$_c$ of tape (1) in a higher magnetic field.

The measurement for X-ray diffraction patterns for the MgB$_2$ cores of the tapes (1), (2) and (3) did not reveal any impurity phase in any of them, but confirmed that the known tape (3) was somewhat superior to the tape (2) according to the invention of the present application in crystallinity. On the other hand, the results for the measurement of the AC magnetic field dependence of magnetization indicating the grain connectivity of particles in the tapes shows that the tape (2) according to the invention of the present application was by far superior to the tape (3) in those characteristics.

It can be assumed from these results that the excellent J$_c$ characteristics of the tape (2) according to the invention of the present application are due to its magnetic and grain connectivity improved by the use of a MgB$_2$ powder of low crystallinity and high J$_c$ as the raw material powder.

Figure 5:
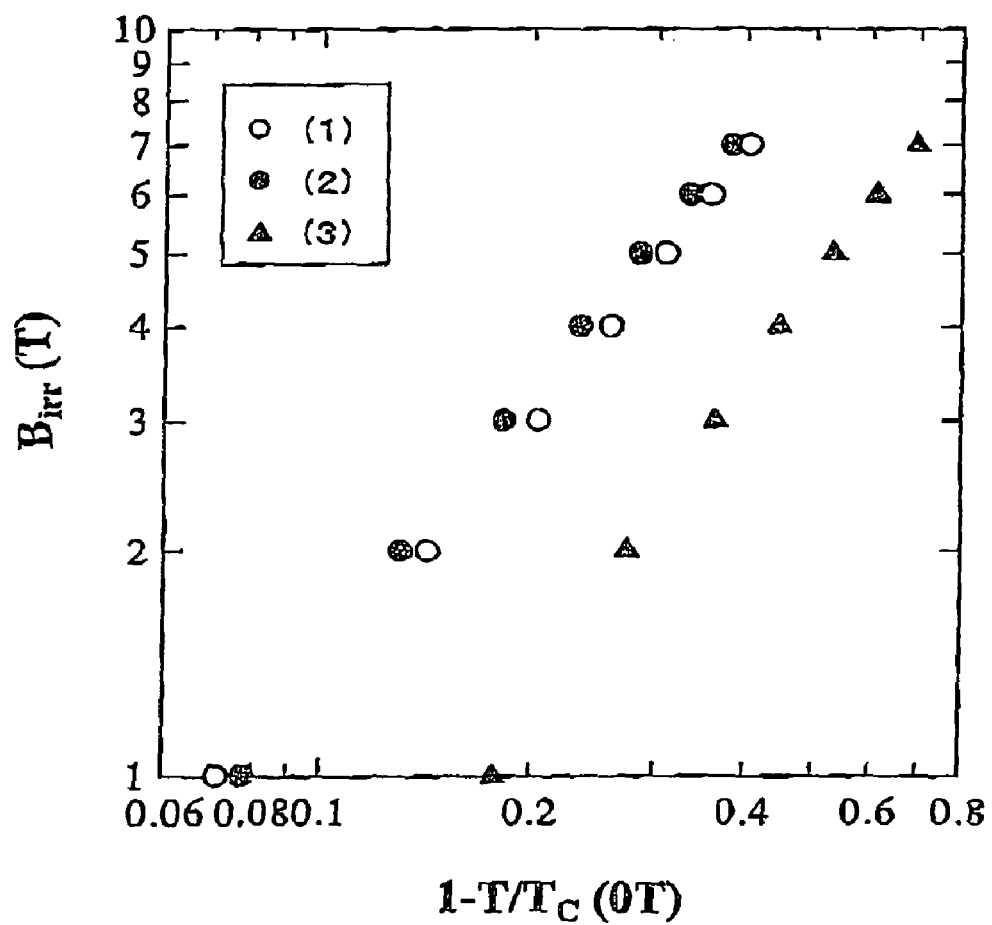
FIG. 5 shows the temperature dependence of the magnetic irreversibility fields (B$_{irr}$) of the Fe-sheathed MgB$_2$ superconducting tapes made in Example 1.

The tapes (1), (2) and (3) were also examined for the temperature dependence of magnetic irreversibility field B$_{irr}$ and the results are shown in FIG. 5. As the characteristics can be considered superior toward the left top of the graph, the magnetic irreversibility field characteristics of the tape (2) according to the invention of the present application were superior to those of the tapes (3) and (1) and showed that it was a material resisting a lowering of J$_c$ irrespective of any change in temperature or magnetic field.

Example 2

The tapes (2) and (3) of Example 1 were heat treated at 600° C. to yield tapes (4) and (5), respectively. A tape (6) was obtained by adding 7.5 mol % of a SiC nanopowder to the same powder mixture of MgH$_2$ and B powders as of Example 1 and otherwise repeating the steps employed for the tape (4). The SiC nanopowder was of Sigma-Aldrich, about 60 nm dia. and 99.99% purity.

The J$_c$-B characteristics of the tapes (4), (5) and (6) at 4.2 K are shown in FIG. 4. The J$_c$ characteristics of the tape (4) were by far better than those of the tape (2) and even better than those of the tape (1) of Example 1 in a broad range of magnetic fields higher than 8 T. On the other hand, the tape (5) only showed substantially the same J$_c$ characteristics as the tape (3). Although no additional heat treatment had been given to the tape (6), it confirmed the possibility of obtaining excellent J$_c$-B characteristics comparable to those of the tape (4) which had been heat-treated at 600° C.

Example 3

Figure 6:
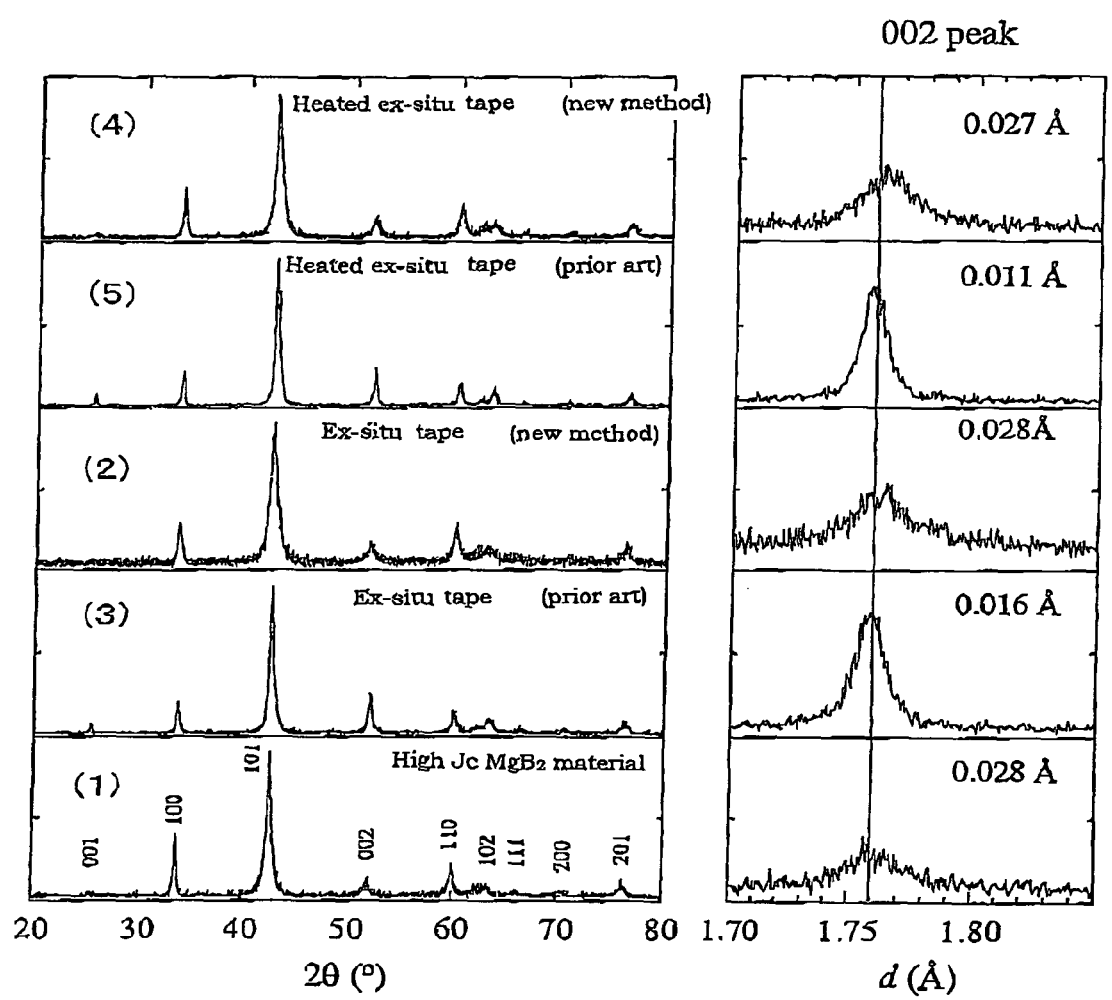
FIG. 6 shows X-ray diffraction patterns showing the crystallinity of MgB$_2$ of Fe-sheathed MgB$_2$ superconducting tapes in Example 3.

The tapes (2) and (4) according to the invention of the present application and the tape (1) by the known in-situ process and the tapes (3) and (5) by the ex-situ process, which were the same as those of Examples 1 and 2, were employed as samples and their crystallinity was checked from X-ray diffraction patterns and the results are shown in FIG. 6. The AC magnetic field dependence of superconducting transition of each sample was evaluated by measuring the temperature dependence of magnetization at different AC magnetic fields and the results are shown in FIG. 7.

Although FIG. 6 does not show the presence of any impurity in all MgB$_2$ samples, the X-ray diffraction patterns of the tapes (2) and (4) according to the invention of the present application were found broad as a whole and the better crystallinity of the known tapes (1), (3) and (5) was confirmed. While a MgB$_2$ superconducting tape is considered to have better characteristics when grain aligned along the c-axis, the known tapes (3) and (5) are apparently grain aligned along the c-axis, since they showed a higher 002 peak than the tapes (2) and (4) according to the invention of the present application.

Figure 7:
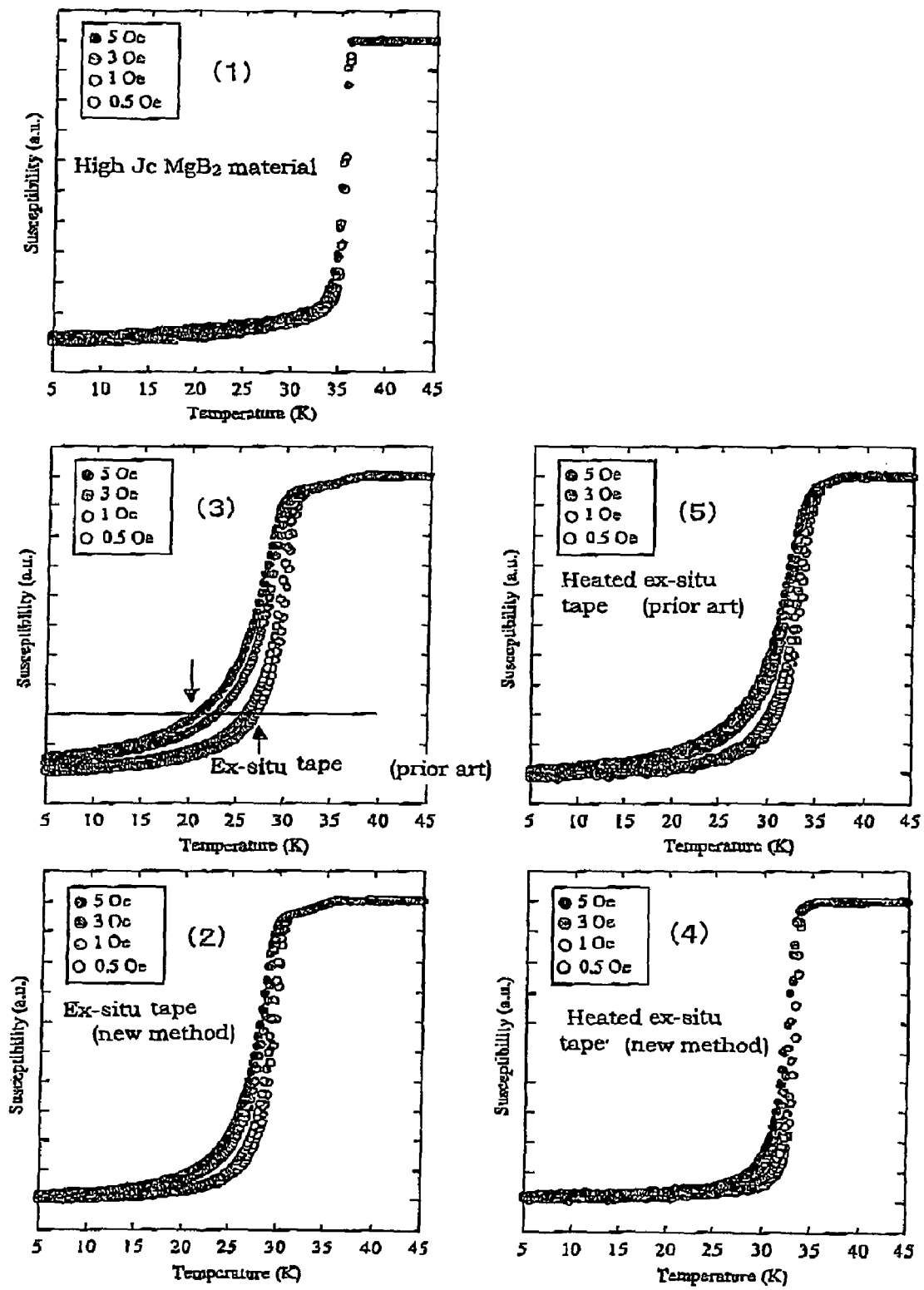
FIG. 7 shows the AC magnetic field dependence of superconducting transition curve of Fe-sheathed MgB$_2$ superconducting tapes in Example 3.

FIG. 7 shows that the T$_c$ for all samples is lower than the known T$_c$ (39 K) of MgB$_2$. It, therefore, follows that the MgB$_2$ powder obtained from tape (1) and used as the starting material for the invention of the present application does not have any high T$_c$. Such deterioration of T$_c$ is considered to be due to the low sintering-level of the powder in the case of the tape (1) and from the stress effect introduced at the time of tape formation in the case of the tapes (2), (3), (4) and (5). The T$_c$ of the tape (2) according to the invention of the present application which had been made from the tape (1) was found lower than that of the tape (3) formed from the commercially available MgB$_2$ powder.

On the other hand, it is generally considered that a sample with superconducting transition curve broaden with a change in applied magnetic field has poor gain connectivity. It was confirmed that the MgB$_2$ powder used as the starting material in the invention of the present application had very excellent grain connectivity, since it had the same physical properties as the tape (1). The grain connectivity of the tape (2) according to the invention of the present application which had been formed from that MgB$_2$ powder are considered as being superior to those of the tape (3) formed from the commercially available MgB$_2$ powder and further superiority of the tape (4) which had been given additional heat treatment was confirmed.

Figure 8:
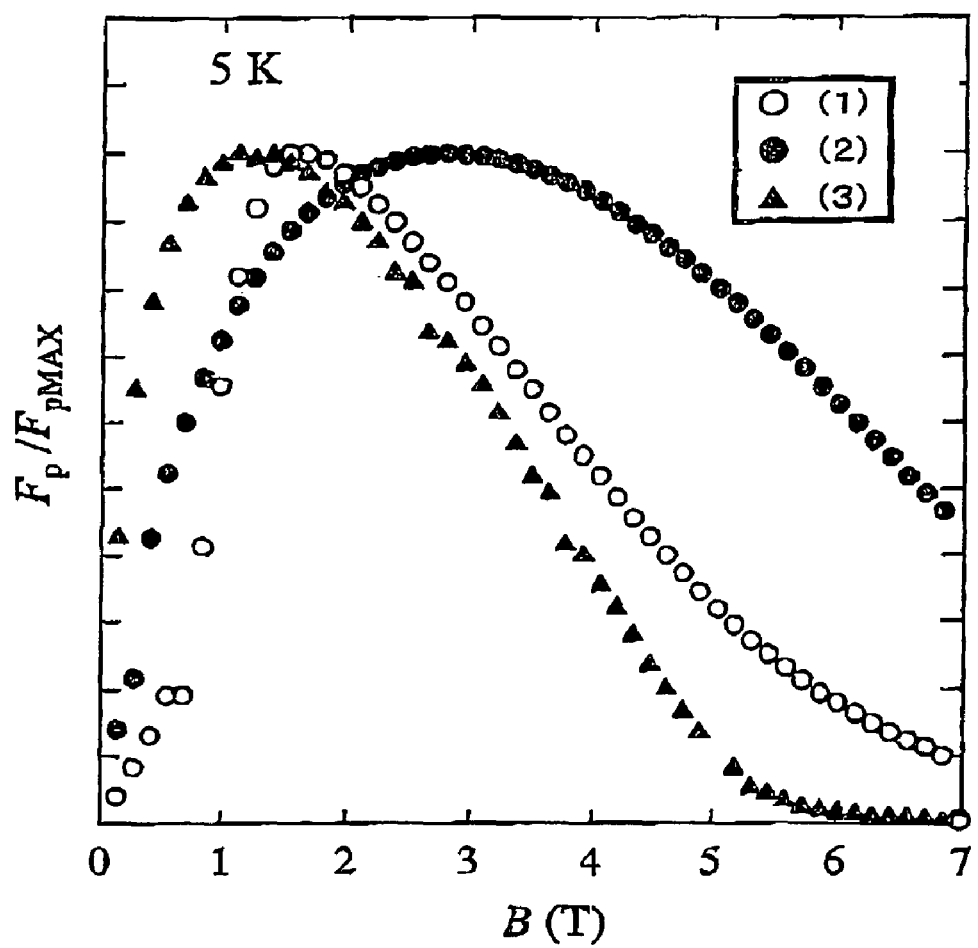
FIG. 8 shows the magnetic field dependence of the normalized pinning force of the MgB$_2$ powder and Fe-sheathed MgB$_2$ superconducting tapes in Example 3.

FIG. 8 shows the magnetic field dependence of the normalized pinning force of the tapes (1), (2) and (3). The magnetic field dependence of the normalized pinning force indicates excellent high-magnetic field characteristics when the peak of the curve is located on the right side of the graph and it does not drop even in a high magnetic field. FIG. 8 confirms that the tape (2) was definitely superior to the tape (3) in pinning force characteristics in a high magnetic field. This improvement in the magnetic field dependence of the normalized pinning force was due to an improved magnetic irreversibility field and the use of a MgB$_2$ powder of high J$_c$ as the raw material was found to improve the magnetic irreversibility field of the tape over that of any known tapes.

Example 4

An Al-sheathed MgB$_2$ tape (7) according to the invention of the present application and an Al-sheathed MgB$_2$ tape (8) by the known method were prepared by filling with the MgB$_2$ powder obtained from the tape (1) of Example 1 and with the MgB$_2$ powder used in the known ex-situ process into the same shape of Al tubes (sheath material) and by forming them into the tape, respectively.

Figure 9:
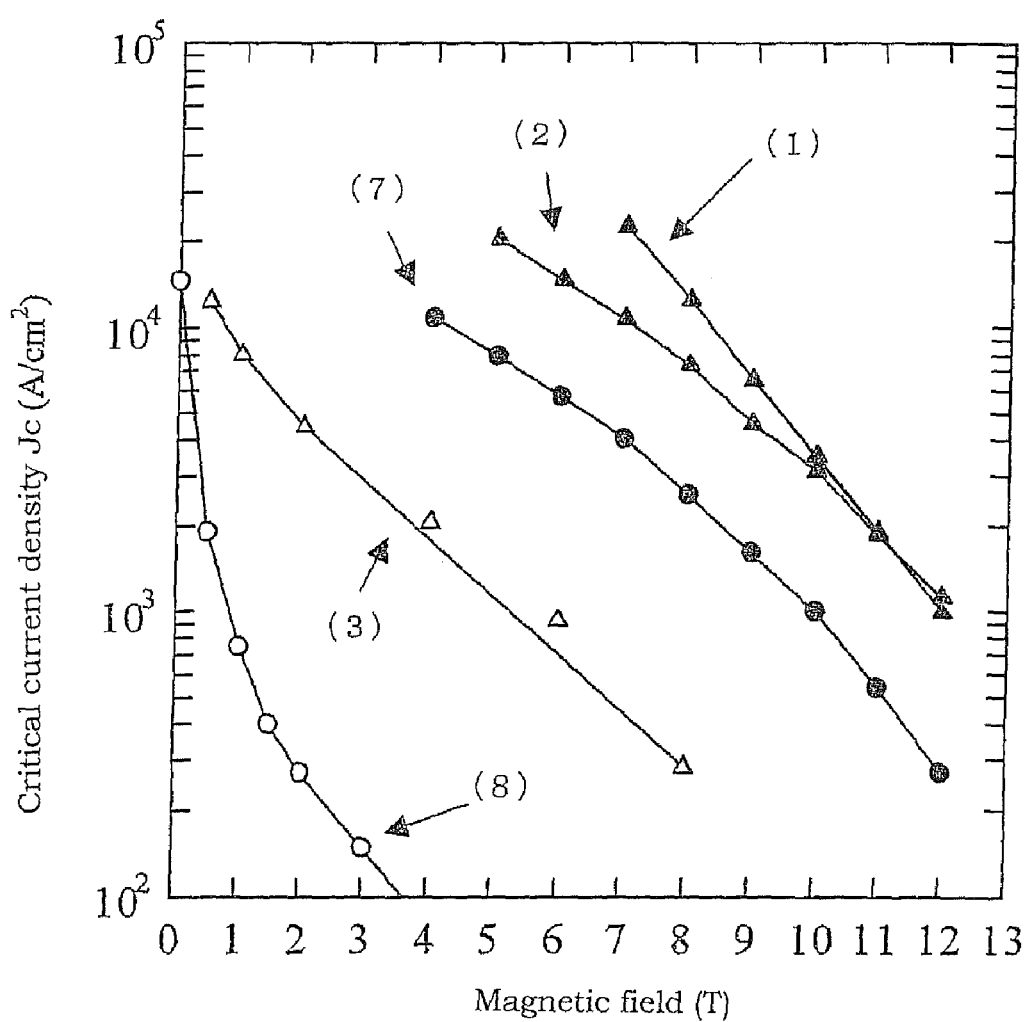
FIG. 9 shows the J$_c$-B characteristics of MgB$_2$ superconducting tapes in Example 4.

The J$_c$-B characteristics of the tapes (7) and (8) are shown in FIG. 9 with those of the Fe-sheathed tapes (1), (2) and (3) of Example 1. It was confirmed that though the tapes (7) and (8) having Al as the sheath material were both lower in J$_c$-B characteristics than the tapes (2) and (3) having Fe as the sheath material, the Al-sheathed MgB$_2$ tape (7) according to the invention of the present application had by far higher characteristics than the known Fe-sheathed MgB$_2$ tape (3). It was confirmed that the tape (7) showed a J$_c$ as high as $1.1 \times 10^4$ A/cm$^2$ at 4 T and 4.2 K and a practically satisfactory level as high as $1.0 \times 10^3$ A/cm$^2$ (10 T and 4.2 K) even in a high magnetic field over 7 T where the tape (3) had not shown superconducting characteristics.

For reference, FIG. 10 compares the J$_c$-B characteristics of the tapes (7) and (8) with the characteristics of the known highest quality tapes made by the ex-situ process. When the Al-sheathed MgB$_2$ tape (7) according to the invention of the present application is compared with the ex-situ MgB$_2$ tape having a sheath tube of other than Al, it is obvious that it shows unparalleled characteristics in a high magnetic field for a tape without heat treatment. In case of the comparison for heat-treated tapes, it was comparable in characteristics in a high magnetic field to those tapes of the highest quality.

Figure 11:
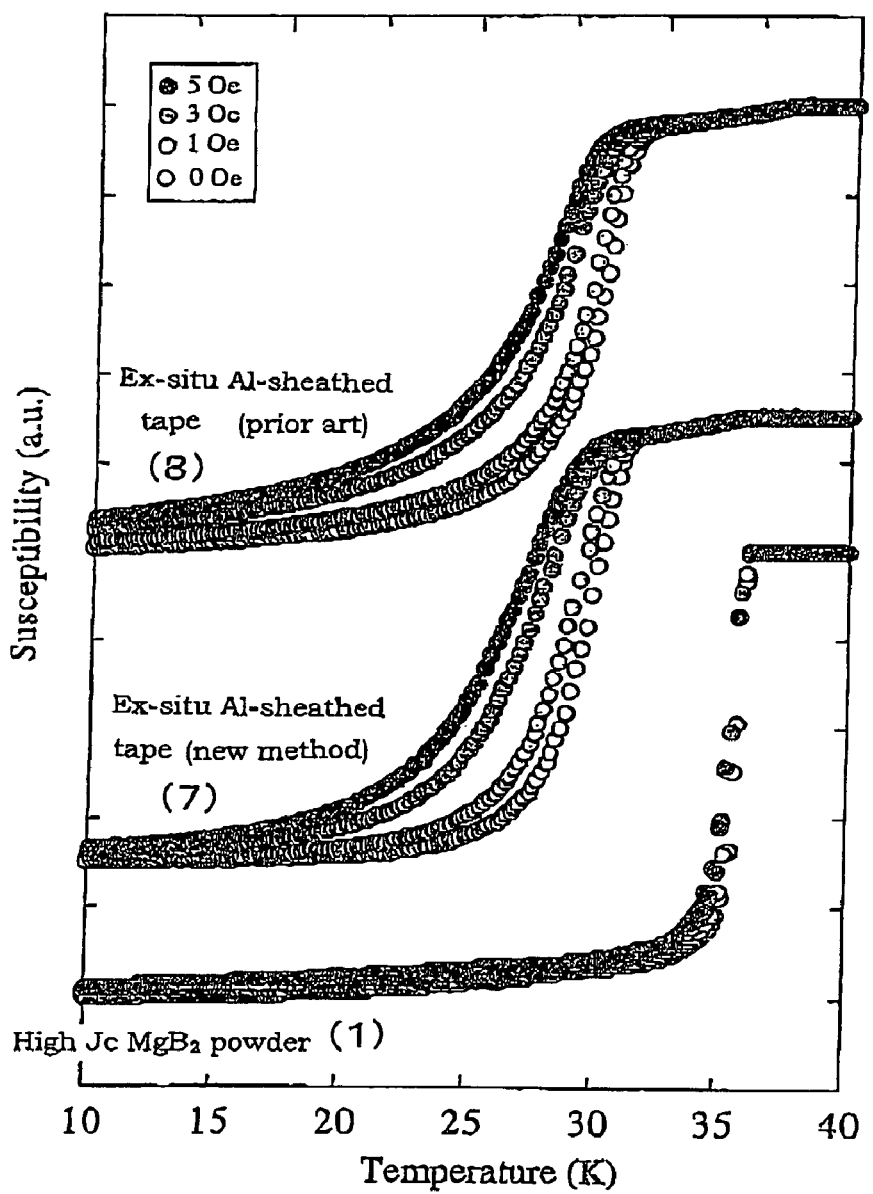
FIG. 11 shows the AC magnetic field dependence of superconducting transition of Al-sheathed MgB$_2$ superconducting tapes in Example 4.

FIG. 11 shows the AC magnetic field dependence of superconducting transition of the tape (1) and the tapes (7) and (8). FIG. 11 confirms that the tape (1) used as the starting material for the tape (7) according to the invention of the present application has very excellent grain connectivity, though it is not an excellent material since its T$_c$ is high. It is obvious that in the case of the Al-sheathed material, unlike the Fe-sheathed material, the tape (7) is not particularly excellent, as it does not substantially differ from the tape (8) in the grain connectivity. This is apparently due to the fact that Al as a sheath material is lower in strength than Fe, so that it cannot density the superconducting core at the tape forming process.

Figure 12:
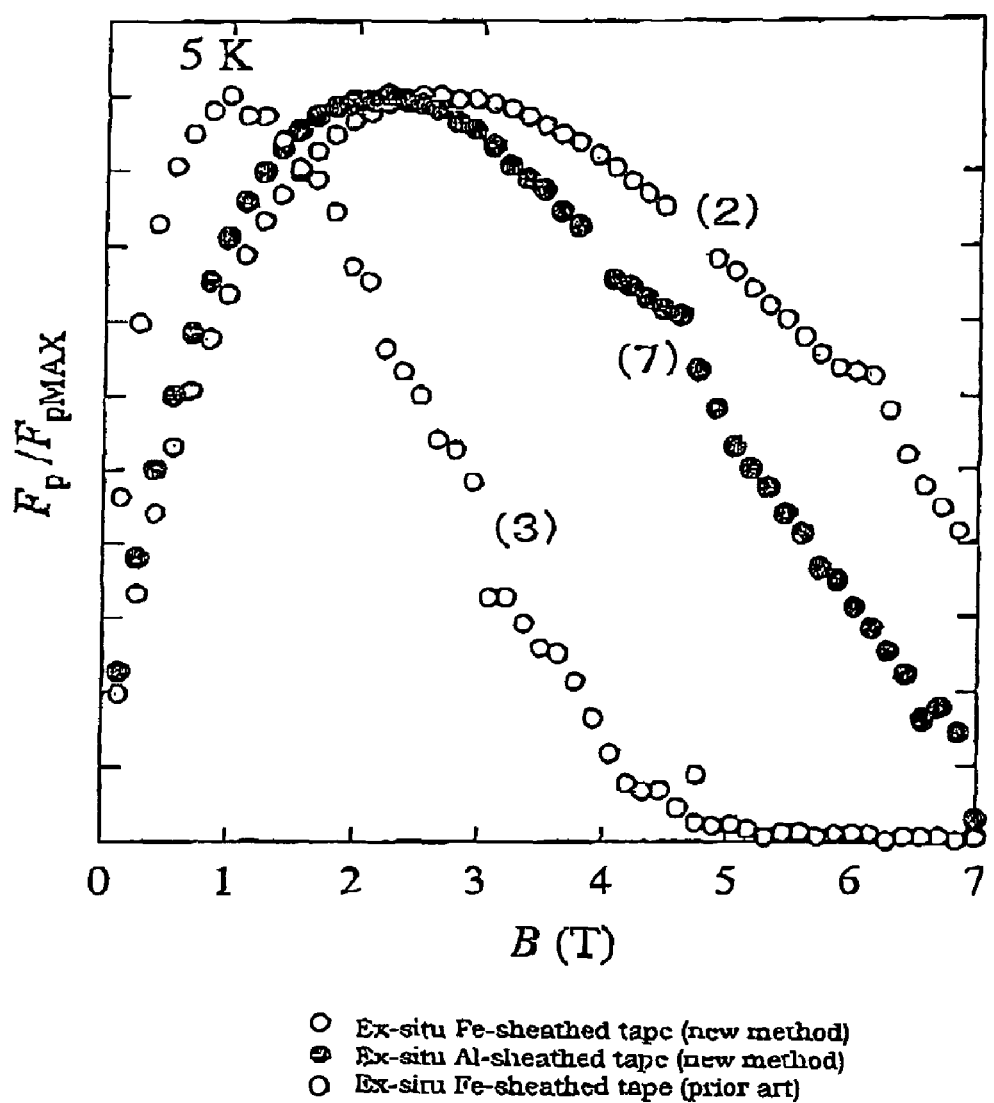
FIG. 12 shows the magnetic field dependence of the normalized pinning force of Al-sheathed and Fe-sheathed MgB$_2$ superconducting tapes in Example 4.

FIG. 12 shows the results about the comparison for the magnetic field dependence of the normalized pinning force between the Al-sheathed tape (7), Fe-sheathed tapes (2) and (3) of Example 1. The magnetic field dependence of the normalized pinning force is considered better when the peak of the curve is located on the right side of the graph and does not drop even in a high magnetic field, and it was confirmed that the tape (7) was definitely superior in pinning force to the known Fe-sheathed tape, though it was somewhat inferior in pinning force to the tape (2). This improvement in the magnetic field dependence of the normalized pinning force was due to an improved magnetic irreversibility field and it indicates that to improve the magnetic irreversibility field of the tape is improved even though the case employing Al as the sheath material by utilizing the MgB$_2$ powder with high J$_c$ as the raw material.

Example 5

A tape with 10 mol % of SiC addition was fabricated by the same way with the tape (6) of the invention of the present application fabricated from the raw material powder with 7.5 mol % of SiC powder addition in Example 2, and was heat treated at a temperature of 700° C. higher than the heat treatment temperature employed for (6) to make a tape (9) according to the invention of the present application.

Figure 13:
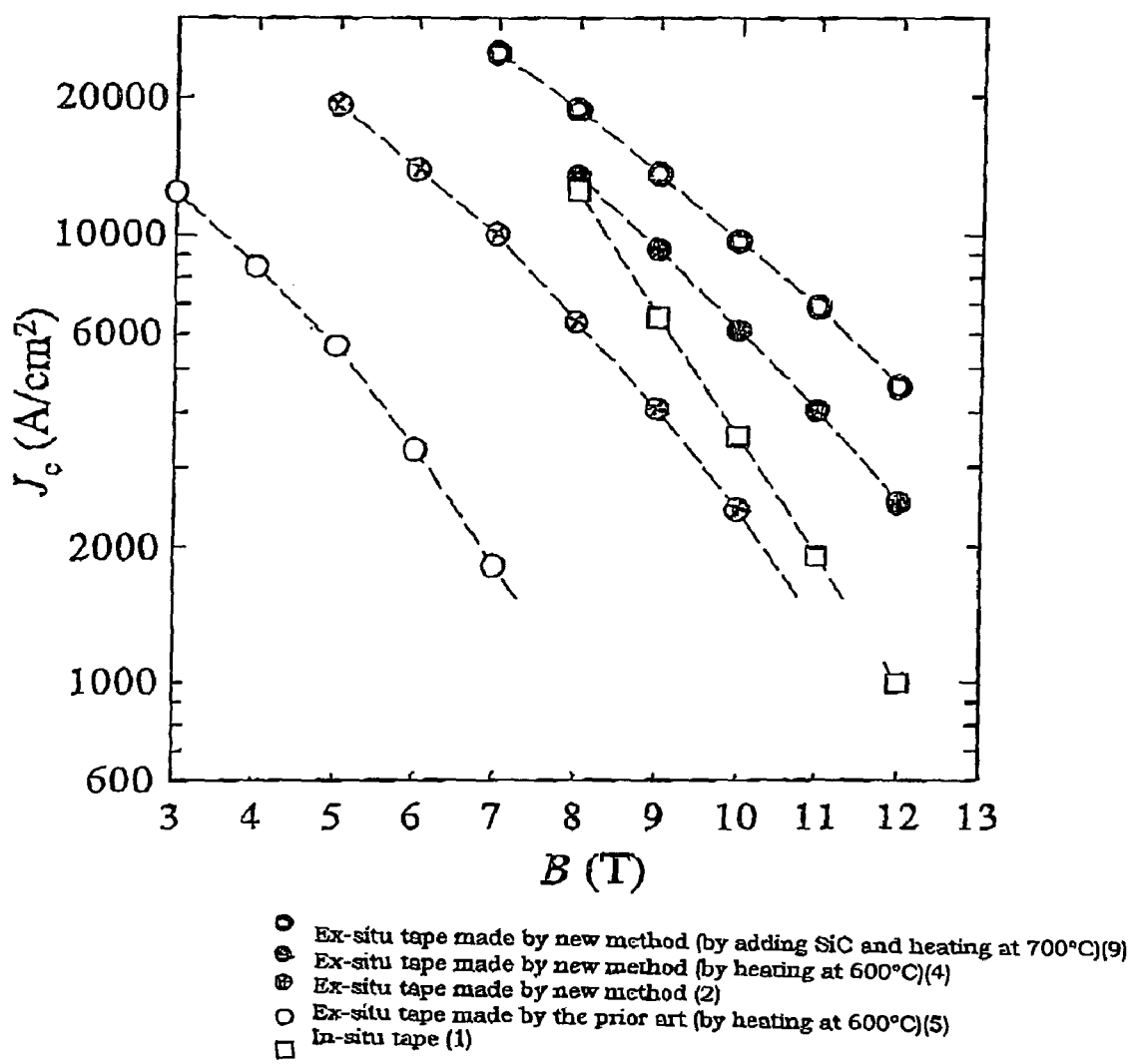
FIG. 13 shows the J$_c$-B characteristics in Example 5.

The tape (9) was evaluated for J$_c$-B characteristics. The results are shown in FIG. 13 in comparison with those of the tapes (2) and (4) according to the invention of the present application, the ex-situ tape (5) by the known method (heated at 600° C.) and the in-situ tape (1) which have been described before.

As is obvious from FIG. 4, the J$_c$ of the tape (4) of the invention of the present application obtained by heat treatment at 600° C. is higher than that of the tape (5) by the known method and is higher than that of the in-situ tape (1) in a high magnetic field over 8 T. It is obvious from FIG. 13 that the J$_c$ of the tape (9) of the invention of the present application obtained by heat treating the ex-situ tape formed from the MgB$_2$ powder prepared with SiC addition to the Mg and B materials is still improved to a value of 9,000 A/cm$^2$ or more at 10 T.

Figure 14:
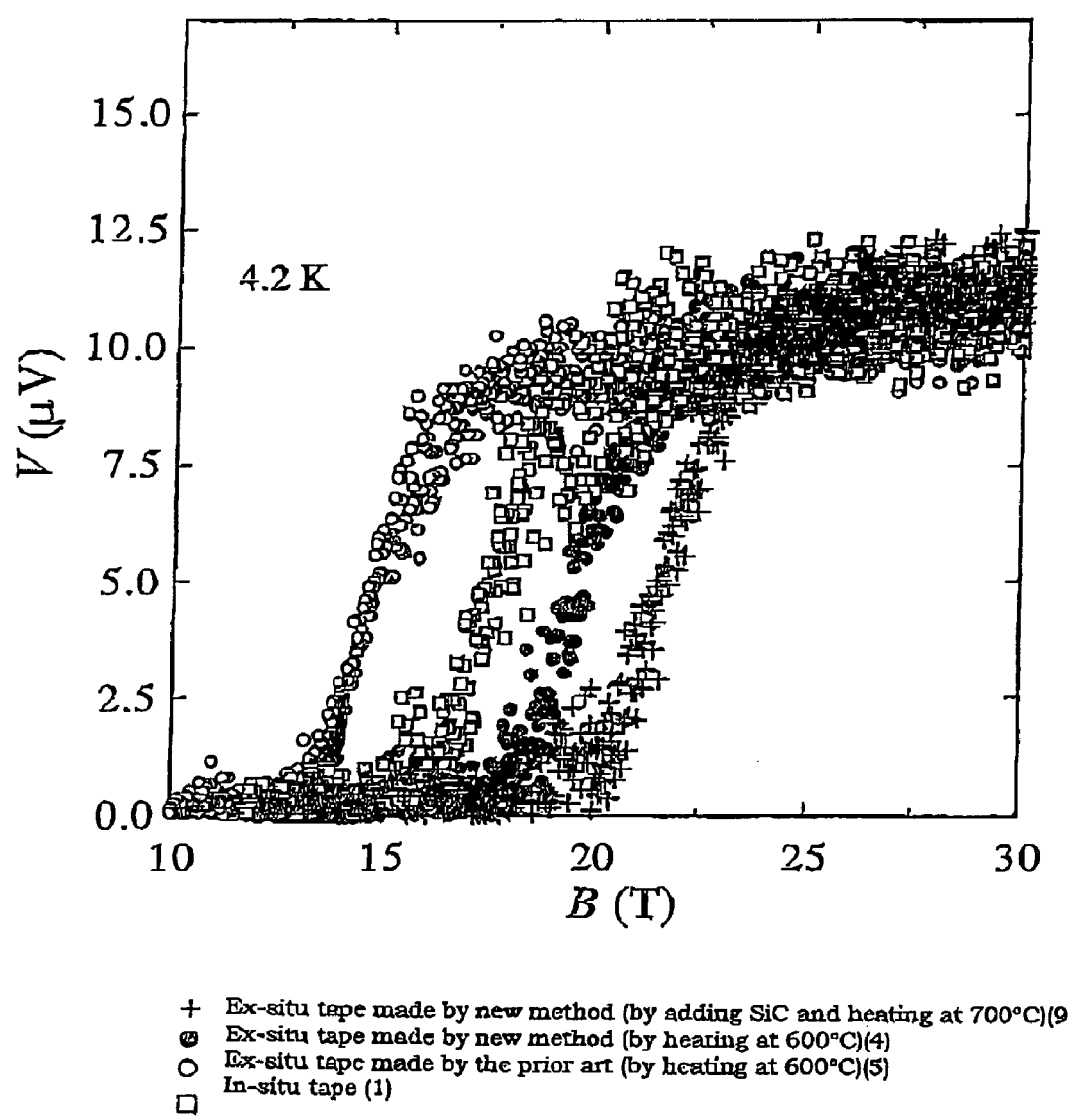
FIG. 14 shows the magnetic field dependence of resistive voltage against applied current (160 mA) in Example 5.

FIG. 14 shows the results obtained by determining the magnetic field dependence of resistive voltage (corresponding to electric resistivity) against an applied electric current (160 mA) for the tape (9), as well as the tapes (4), (5) and (1). When the magnetic field is low, a superconducting state prevails and as there is no electric resistance, there is no voltage. With an increase in magnetic field, however, the superconducting state is destroyed and there is a rise in voltage. The value of the magnetic field at which the voltage rises from zero is the magnetic irreversibility field, and the higher the magnetic irreversibility field of a sample, the higher its J$_c$ is. According to FIG. 14, the magnetic irreversibility of each tape is:

in-situ tape (1): 16.2 T
ex-situ tape (known method) (5): 13.8 T
ex-situ tape (new method) (4): 18.2 T
ex-situ tape (new method with SiC addition) (9); 20.2 T and it is obvious that the tapes (4) and (9) according to the invention of the present application are superior in magnetic irreversibility field to the tape (5) by the known method and the in-situ tape (1).

Example 6

A tape (10) according to the invention of the present application was fabricated by adding In (10 mol %) to the MgB$_2$ powder used as the raw material for the tape (2) according to the invention of the present application and heating it at 600° C. as when the tape (4) had been made.

Figure 15:
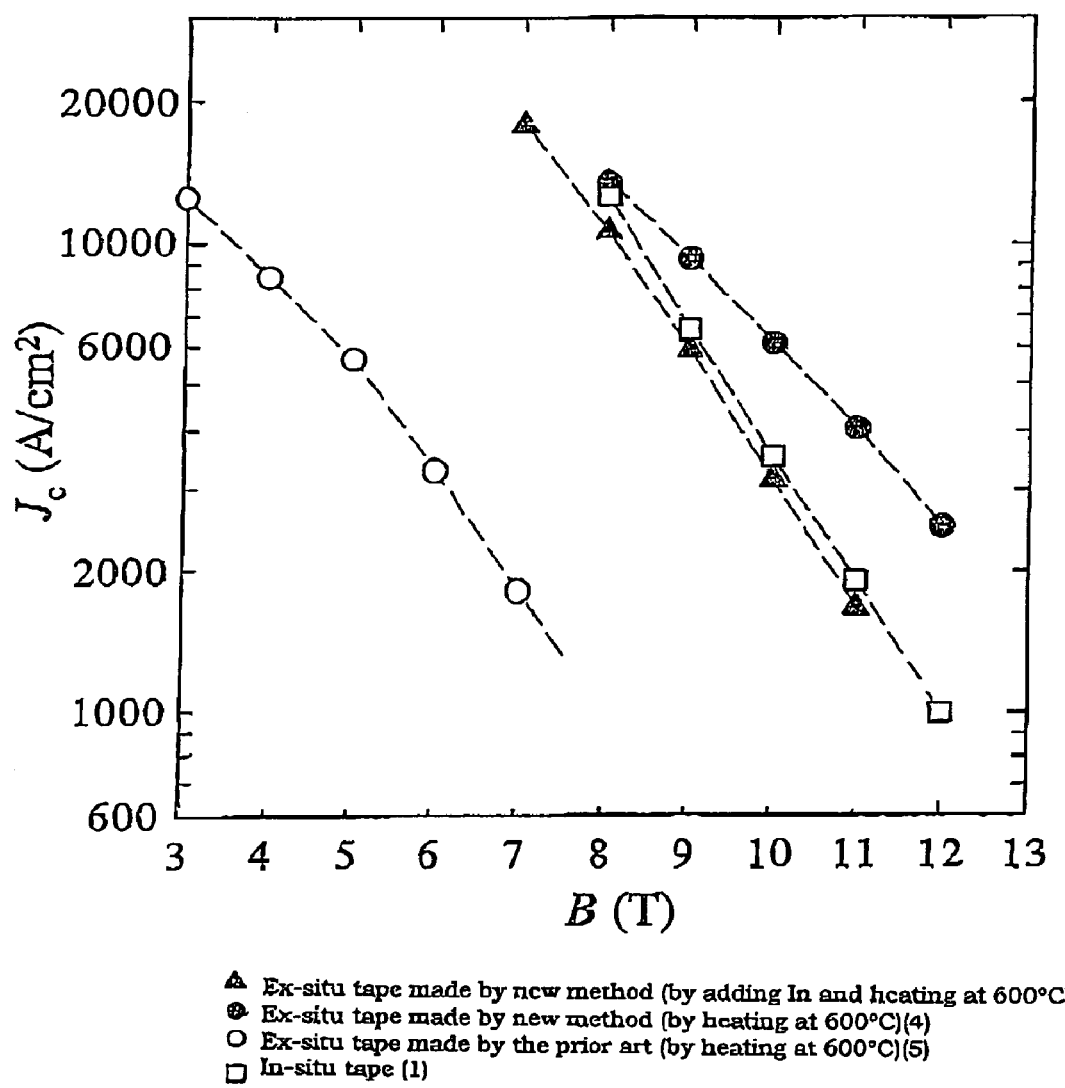
FIG. 15 shows the J$_c$-B characteristics in Example 6.

The tape (10) was evaluated for J$_c$-B characteristics and the results are shown in FIG. 15 in comparison with those of the tapes (4), (5) and (1).

The tape (4) according to the invention of the present application showed a J$_c$ higher than that of the in-situ tape (1) in a high magnetic field over 8 T, but its less gradient in J$_c$-B characteristics made its J$_c$ lower than that of the tape (1) in a lower magnetic field. However, it is obvious from FIG. 15 that the ex-situ tape (10) made by In (10 mol %) addition to the raw material powder showed a similar gradient in J$_c$-B characteristics to that of the in-situ tape (1) and had a high J$_c$ even in a low magnetic field.

Example 7

The tapes according to the invention of the present application were evaluated for the influence of different conditions of heat treatment.

Figure 16:
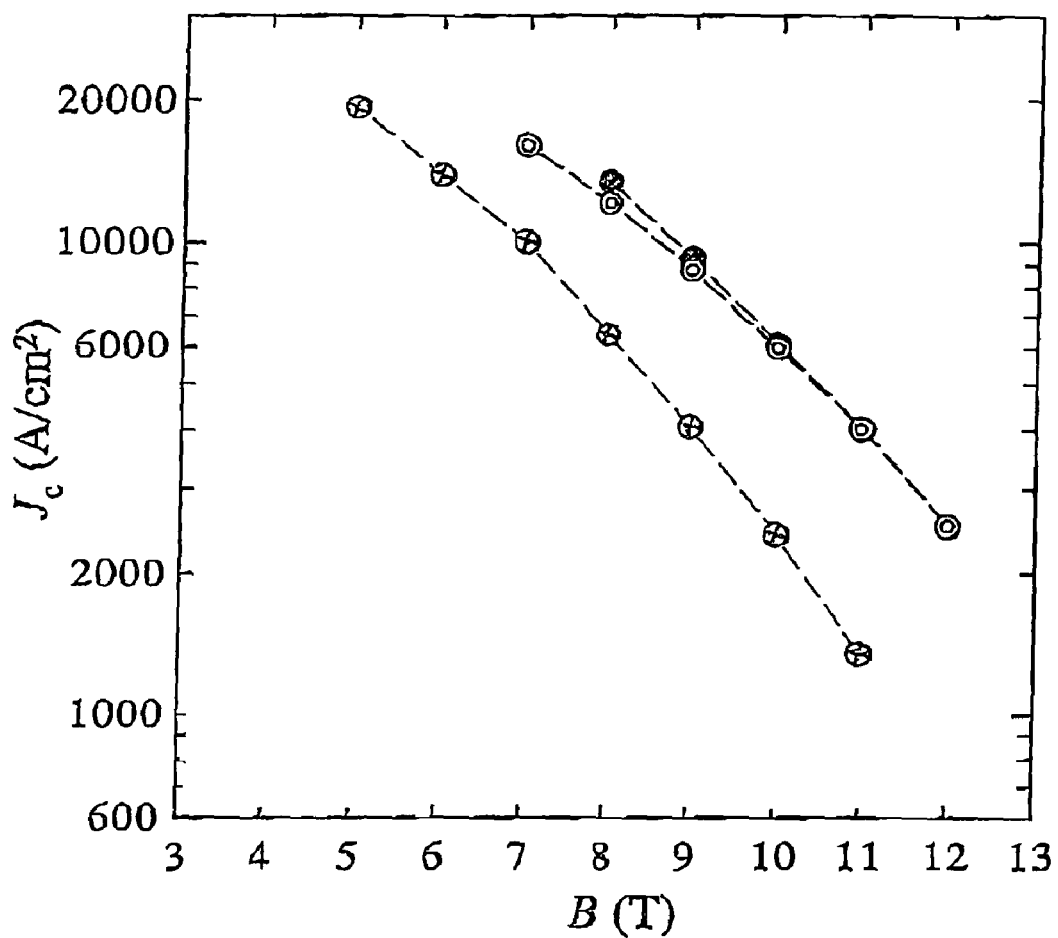
FIG. 16 shows the J$_c$-B characteristics in Example 7.

Tapes (11) and (12) according to the invention of the present application were fabricated by the same way as the tape (4) in Example 2, but by an hour of heat treatment at 600° C. and 10 hours of heat treatment at 300° C., and the results of their evaluation for J$_c$-B characteristics are shown in FIG. 16 in comparison with those of the tape (2) without heat treatment according to the invention of the present application.

It is obvious that the conditions of heat treatment are not limited to a high temperature of 600° C. or above as in the case of any ordinary ex-situ tape, but that if the time for heat treatment is prolonged, a temperature as low as 300° C. makes it possible to obtain the same J$_c$-B characteristics as those obtained by heating at 600° C.

INDUSTRIAL APPLICABILITY

The fabrication method of a $MgB_2$ superconducting tape and wire according to the first invention of the present application makes it possible to obtain even by the ex-situ process a superconducting tape and wire having a satisfactorily high $J_c$ characteristics, for example, a $J_c$ value improved by one figure or more over the prior art. According to the second invention, there is provided a method of preparing a $MgB_2$ superconducting powder which is suitable for use in the ex-situ process.

The fabrication method of a $MgB_2$ superconducting tape and wire according to the third and fourth inventions of the present application makes it possible to improve various characteristics of a $MgB_2$ superconducting tape and wire even without giving any heat treatment to the tape and wire.

Moreover, the fifth invention makes it possible to choose a metal having the desired properties as the sheath material and the sixth invention makes it possible to obtain a $MgB_2$ superconducting powder of high quality which is low in reactivity with a metal tube. The seventh invention makes it possible to obtain a $MgB_2$ superconducting tape and wire of high $J_c$ characteristics having Al as the sheath material and explore a drastically broad scope of use for a $MgB_2$ superconducting tape and wire.

The eighth invention makes it possible to fabricate a $MgB_2$ superconducting tape and wire in the form of any desired multicore tape and wire, and the ninth invention makes it possible to obtain a $MgB_2$ superconducting tape and wire having further improved characteristics by the heat treatment after tape (or wire) forming process.

The tenth to fourteenth inventions realize the use of a $MgB_2$ superconducting tape and wire having excellent characteristics as stated above and an Al-sheathed $MgB_2$ superconducting tape and wire.

In addition, the fifteenth invention makes it possible to realize any article that is useful in a variety of fields, for example, in the form of a on-board magnet for a lightweight rocket, or maglev train or a low-induced-radioactivity-magnet for the plasma confinement of a nuclear fusion reactor.

The invention claimed is:

1. A method of fabricating a $MgB_2$ superconducting tape or wire which comprises:
   A) mixing starting material powder comprising magnesium (Mg) or magnesium hydride ($MgH_2$) and boron (B) in a range of 0.9:2 to 1.1:2 to produce a powder mixture,
   B) filling the powder mixture into a tube serving as a sheath material,
   C) forming the tube into a tape or wire,
   D) heat treating the tape or wire,
   E) removing the sheath from the tape or wire,
   F) obtaining $MgB_2$ superconducting powder from the tape or wire, wherein a $MgB_2$ superconducting powder having its critical current density ($J_c$) raised by its lowered crystallinity, and, by its higher potential for excellent grain connectivity, evaluated from full width of half maximum 002 peak for X-ray diffraction pattern of $MgB_2$ superconducting powder, larger than 0.002 nm,
   G) filling the superconducting powder into a tube, and
   H) forming the tube into a tape or wire.

2. A method as set forth in claim 1, wherein a powder of a ceramic material containing carbon (C), a transition metal or an aromatic organic compound is added to the starting material powder mixture in step A.

3. A method as set forth in claim 1, wherein a powder of SiC or indium is added to the superconducting powder mixture in step G.

4. A method as set forth in claim 2, wherein a powder of SiC or ceramic material containing carbon (C) having a powder particle average diameter less than 100 μm is added to the starting material powder mixture in step A.

5. A method as set forth in claim 3, wherein a powder of SiC or indium with average diameter less than 100 μm is added to the superconducting powder mixture in step G.

6. A method as set forth in claim 1, wherein the tube is a metal tube containing one or more of the elements Fe, Cu, Al, Nb, Ti, Mg, Ag, Au and Li.

7. A method as set forth in claim 1, wherein the tube filled with the starting material powder mixture in step B is an Fe tube.

8. A method as set forth in claim 1, wherein the tube filled with the $MgB_2$ superconducting powder in step G is an Al tube.

9. A method as set forth in claim 1, wherein a multicore tape or wire is formed by bundling a plurality of tubes filled with the $MgB_2$ superconducting powder in step H.

10. A method as set forth in claim 1, wherein a multicore tape or wire is formed by preparing a metal tube having a plurality of bores and filling the bores with a superconducting powder mixture in step G.

11. A method as set forth in claim 1, wherein the tape or wire formed from the tube filled with the $MgB_2$ superconducting powder in step H is heat treated.

* * * * *